(12) United States Patent
Lee

(10) Patent No.: US 9,595,694 B2
(45) Date of Patent: Mar. 14, 2017

(54) THIN FILM TRANSISTOR SUBSTRATE, ORGANIC LIGHT-EMITTING APPARATUS INCLUDING THE SAME, METHOD OF MANUFACTURING THE THIN FILM TRANSISTOR SUBSTRATE, AND METHOD OF MANUFACTURING THE ORGANIC LIGHT-EMITTING APPARATUS

(71) Applicant: Samsung Display Co., Ltd., Yongin, Gyeonggi-Do (KR)

(72) Inventor: Dong-Won Lee, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 197 days.

(21) Appl. No.: 14/013,871

(22) Filed: Aug. 29, 2013

(65) Prior Publication Data
US 2014/0175396 A1 Jun. 26, 2014

(30) Foreign Application Priority Data
Dec. 20, 2012 (KR) .......................... 10-2012-0149761

(51) Int. Cl.
| | | |
|---|---|---|
| *H01L 27/32* | (2006.01) | |
| *H01L 51/56* | (2006.01) | |
| *H01L 29/66* | (2006.01) | |
| *H01L 29/786* | (2006.01) | |
| *H01L 27/12* | (2006.01) | |

(52) U.S. Cl.
CPC .......... *H01L 51/56* (2013.01); *H01L 27/1218* (2013.01); *H01L 27/1262* (2013.01); *H01L 29/66757* (2013.01); *H01L 29/78636* (2013.01); *H01L 27/3262* (2013.01)

(58) Field of Classification Search
CPC ... H01L 51/5203; H01L 51/56; H01L 29/786; H01L 29/6675
USPC .......................... 257/40, 59, 72; 438/34, 149
See application file for complete search history.

(56) References Cited

U.S. PATENT DOCUMENTS 5,574,292 A * 11/1996 Takahashi et al. . G02F 1/13454
257/103
6,271,897 B1 * 8/2001 Ichikawa et al. ............... 349/43
(Continued)

FOREIGN PATENT DOCUMENTS

| KR | 10-2007-0096702 A | 10/2007 |
|---|---|---|
| KR | 10-2008-0065933 A | 7/2008 |

(Continued)

*Primary Examiner* — Roy Potter
*Assistant Examiner* — Paul Patton
(74) *Attorney, Agent, or Firm* — Knobbe Martens Olson & Bear LLP

(57) ABSTRACT

A thin film transistor (TFT) substrate which may facilitate subsequent TFT processing by reducing an elevation difference on the top surface of the substrate is disclosed. Aspects include an organic light-emitting apparatus including the TFT substrate, a method of manufacturing the TFT substrate, and a method of manufacturing the organic light-emitting apparatus. In one aspect the TFT substrate includes: a substrate; a height adjusting layer that is disposed on the substrate and has a thickness in a first region greater than a thickness in a second region; and a TFT that is formed on the height adjusting layer to correspond to the second region of the height adjusting layer.

31 Claims, 6 Drawing Sheets

(56) References Cited

U.S. PATENT DOCUMENTS

| | | | |
|---|---|---|---|
| 6,806,917 B2* | 10/2004 | Sekine et al. | G02F 1/136209 257/59 |
| 6,958,251 B2* | 10/2005 | Yamazaki et al. | H01L 27/1214 257/E21.134 |
| 8,076,844 B2 | 12/2011 | Oda et al. | |
| 2003/0082889 A1* | 5/2003 | Maruyama et al. | H01L 27/1214 438/455 |
| 2006/0011921 A1* | 1/2006 | Park et al. | G02F 1/13458 257/72 |
| 2007/0257253 A1 | 11/2007 | Im et al. | |
| 2010/0149476 A1 | 6/2010 | Kim et al. | |
| 2011/0163331 A1 | 7/2011 | Yamazaki et al. | |
| 2012/0097952 A1 | 4/2012 | Kang et al. | |

FOREIGN PATENT DOCUMENTS

| | | |
|---|---|---|
| KR | 10-2011-0025956 A | 3/2011 |
| KR | 10-2012-0043438 A | 5/2012 |

\* cited by examiner

THIN FILM TRANSISTOR SUBSTRATE, ORGANIC LIGHT-EMITTING APPARATUS INCLUDING THE SAME, METHOD OF MANUFACTURING THE THIN FILM TRANSISTOR SUBSTRATE, AND METHOD OF MANUFACTURING THE ORGANIC LIGHT-EMITTING APPARATUS

CROSS-REFERENCE TO RELATED ED APPLICATIONS

This application claims the benefit of Korean Patent Application No. 10-2012-0149761, filed on Dec. 20, 2012, in the Korean Intellectual Property Office, the disclosure of which is incorporated herein in its entirety by reference.

BACKGROUND

Field

The disclosed technology relates to a thin film transistor (TFT) substrate, an organic light-emitting apparatus including the same, a method of manufacturing the TFT substrate, and a method of manufacturing the organic light-emitting apparatus, and more particularly, to a TFT substrate which may facilitate one or more subsequent TFT processing steps by reducing elevation differences on the processed substrate, an organic light-emitting apparatus including the TFT substrate, a method of manufacturing the TFT substrate, and a method of manufacturing the organic light-emitting apparatus.

Description of the Related Technology

An organic light-emitting display apparatus is a display apparatus including an organic light-emitting device or diode (OLED) in a display region, where the OLED will include a pixel electrode and a counter electrode which face each other, and an intermediate layer that is disposed between the pixel electrode and the counter electrode and includes an emission layer (EML).

According to a method of driving the OLED to emit light, the organic light-emitting display apparatus is classified into either of an active matrix organic light-emitting display apparatus in which each pixel is controlled by a thin film transistor (TFT) thereof to emit light, and a passive matrix light-emitting display apparatus in which each pixel is controlled by electrodes which are arranged in a matrix to emit light. In the active matrix organic light-emitting display apparatus, the organic light-emitting device is typically disposed on the TFT.

SUMMARY OF CERTAIN INVENTIVE ASPECTS

A conventional active matrix organic light-emitting display apparatus has disadvantages in that the probability that an organic light-emitting device will malfunction may be high due to a thin film transistor (TFT) disposed under the organic light-emitting device and only a specific method may be used to form the organic light-emitting device.

The disclosed technology provides a TFT substrate which may facilitate a subsequent process by reducing an elevation difference of a top surface, an organic light-emitting apparatus including the TFT substrate, a method of manufacturing the TFT substrate, and a method of manufacturing the organic light-emitting apparatus. However, the problems to be solved are exemplary and the scope of the disclosed technology is not limited thereto.

According to an aspect of the disclosed technology, there is provided a thin film transistor (TFT) substrate, comprising a substrate; a height adjusting layer that is formed on the substrate and has a thickness in a first region greater than a thickness in a second region; and a TFT that is formed on the height adjusting layer to correspond to the second region of the height adjusting layer.

The difference in the thickness of the height adjusting layer in the first region and the thickness of the height adjusting layer in the second region may correspond to the height of the TFT.

The height adjusting layer comprises an organic material.

The TFT substrate further comprising a planarization film that is formed to cover the height adjusting layer and the TFT.

The TFT substrate further comprising a protective film that is formed between the planarization film, and the height adjusting layer and the TFT.

The TFT substrate may further include a pixel electrode that is electrically connected to the TFT.

According to another aspect of the disclosed technology, there is provided an organic light-emitting apparatus comprising the TFT substrate; an intermediate layer that is formed on the pixel electrode and includes an emission layer (EML); and a counter electrode that is formed on the intermediate layer.

Light may be emitted from the EML to the environment outside the apparatus through the counter electrode.

According to another aspect of the disclosed technology, there is provided a thin film transistor (TFT) substrate, comprising a substrate that has a thickness in a first region greater than a thickness in a second region; and a TFT that is formed on the substrate to correspond to the second region of the substrate.

The difference in the thickness of the substrate in the first region and the thickness of the substrate in the second region may correspond to a height of the TFT.

The substrate is formed of an organic material.

The TFT substrate further comprising a planarization film that is formed to cover the substrate and the TFT.

The TFT substrate further comprising a protective film that is formed between the planarization film, and the substrate and the TFT.

The TFT substrate may further include a pixel electrode that is electrically connected to the TFT.

According to another aspect of the disclosed technology, there is provided an organic light-emitting apparatus including: the TFT substrate; an intermediate layer that is formed on the pixel electrode and includes an emission layer (EML); and a counter electrode that is formed on the intermediate layer.

Light may be emitted from the EML to the environment outside the apparatus through the counter electrode.

According to another aspect of the disclosed technology, there is provided a method of manufacturing a thin film transistor (TFT) substrate, the method comprising forming a height adjusting layer on a substrate such that a thickness of the height adjusting layer in a first region is greater than a thickness of the height adjusting layer in a second region; and forming a TFT on the height adjusting layer to correspond to the second region of the height adjusting layer.

The forming of the height adjusting layer comprises forming the height adjusting layer such that a difference between the thickness of the height adjusting layer in the first region and the thickness of the height adjusting layer in the second region corresponds to a height of the TFT.

The forming of the height adjusting layer comprises forming the height adjusting layer by using an organic material.

The method further comprising forming a planarization film to cover the height adjusting layer and the TFT.

The method further comprising forming a protective film to cover the height adjusting layer and the TFT and forming a planarization film on the protective film.

The method further comprising removing the substrate.

The method further comprising forming a pixel electrode to be electrically connected to the TFT.

The method further comprising removing the substrate.

According to another aspect of the disclosed technology, there is provided a method of manufacturing an organic light-emitting apparatus, the method comprising: preparing a thin film transistor (TFT) substrate manufactured by using the method; forming an intermediate layer including an emission layer (EML) on the pixel electrode; and forming a counter electrode on the intermediate layer.

The method further comprising removing the substrate.

The forming of the intermediate layer comprises forming the intermediate layer by using a liquid process.

BRIEF DESCRIPTION OF THE DRAWINGS

The above and other features and advantages of the disclosed technology will become more apparent by describing in detail exemplary embodiments thereof with reference to the attached drawings in which.

DETAILED DESCRIPTION OF CERTAIN INVENTIVE EMBODIMENTS

Figure 1:
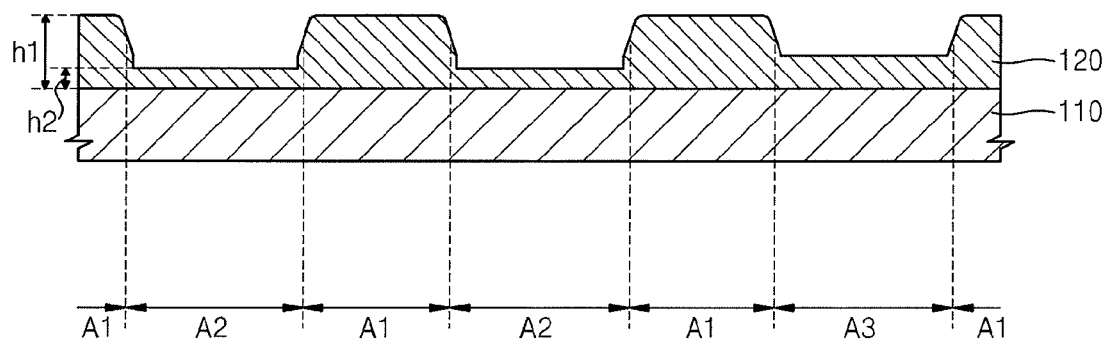
FIGS. 1 through 9 are cross-sectional views illustrating a method of manufacturing an organic light-emitting display apparatus, according to an embodiment of the disclosed technology.

The invention will be described more fully hereinafter with reference to the accompanying drawings, in which embodiments of the invention are shown. This should not be construed as limiting the claims to the embodiments shown. Rather, these embodiments are provided to convey the scope of the invention to one of ordinary skill in the art. Sizes of elements in the drawings may be exaggerated or reduced for convenience of explanation. That is, since sizes and thicknesses of elements in the drawings are exemplary, the present embodiment is not limited thereto.

It will be understood that when an element such as a layer, a film, a region, or a plate is referred to as being "on" another element, it can be directly on the other element or intervening elements can be present.

FIGS. 1 through 9 are cross-sectional views illustrating a method of manufacturing an organic light-emitting display apparatus, according to an embodiment of the disclosed technology.

Referring to FIG. 1, a height adjusting layer 120 is formed on a substrate 110. If necessary, a layer such as a buffer layer (not shown) may be additionally disposed between the substrate 110 and the height adjusting layer 120. The buffer layer may be formed on an entire surface of the substrate 110 or may be formed in a patterned shape on the substrate 110. For example, a polyimide layer may be formed on the entire surface of the substrate 110 and an inorganic insulating layer may be formed on an entire surface of the polyimide layer, so that the height adjusting layer 120 is formed on the inorganic insulating layer. In this case, an additional polyimide layer may be interposed in the polyimide layer and the inorganic insulating layer. The height adjusting layer 120 may be formed on the entire surface of the substrate 110, or may not exist in a portion of the substrate 110.

The substrate 110 may be formed of any of various materials such as a glass material, a metal material, or a plastic material such as polyethylene terephthalate (PET), polyethylene naphthalate (PEN), or polyimide.

The height adjusting layer 120 may be formed on the substrate 110 such that a thickness h1 of the height adjusting layer 120 in a first region A1 is greater than a thickness h2 of the height adjusting layer 120 in a second region A2. The first region A1 and the second region A2 may be alternately arranged as shown in FIG. 1, but intervals between and areas of the first region A1 and the second region A2 do not have to be constant. Alternatively, the height adjusting layer 120 may be modified in a variety of ways, for example, to have a third region A3 in which a thickness of the height adjusting layer 120 is different from the thickness h2 of the height adjusting layer 120 in the first region A1 and the thickness h2 of the height adjusting layer 120 in the second region A2.

The thickness h1 of the height adjusting layer 120 in the first region A1 may also vary. In some embodiments, the thickness h1 can be in the range of about 0.15 μm to about 15 μm. In some embodiments, the thickness h1 can be in the range of about 0.5 μm to about 15 μm. In some embodiments, the thickness h1 can be in the range of about 1 μm to about 15 μm, about 2 μm to about 13 μm, about 5 μm to about 15 μm, about 5 μm to about 10 μm, and about 8 μm to about 10 μm. In some embodiments, the thickness h1 can be no greater than 15 μm, no greater than 12 μm, no greater than 10 μm, no greater than 8 μm, and no greater than 6 μm.

The thickness h2 of the height adjusting layer 120 in the first region A2 can also vary. In some embodiments, the thickness h2 can be in the range of about 0.1 μm to about 5 μm. In some embodiments, the thickness h2 can be in the range of about 0.5 μm to about 5 μm. In some embodiments, the thickness h2 can be in the range of about 1 μm to about 5 μm, about 0.1 μm to about 3 μm, about 0.1 μm to about 2 μm, 0.5 μm to about 3 μm, about 0.5 μm to about 2 μm, about 0.5 μm to about 1 μm, and about 1 μm to about 3 μm. In some embodiments, the thickness h2 can be no greater than 5 μm, no greater than 4 μm, no greater than 3 μm, no greater than 2 μm, and no greater than 1 μm.

The height adjusting layer 120 may be formed of, for example, an organic material. The height adjusting layer 120 may be formed to have a single-layer structure or a multi-layer structure by using a material such as PET, PEN, polyacrylate, or polyimide. When the height adjusting layer 120 is formed by using such an organic material, the organic light-emitting display apparatus may be flexible as will be described below. The height adjusting layer 120 does not have to be formed of an organic material, and may be formed of silicon oxide or silicon nitride. Alternatively, the height adjusting layer 120 may be formed of a combination of an organic material and an inorganic material. Also, the height adjusting layer 120 may be modified in a variety of ways, for example, to have a single-layer structure or a multi-layer structure. The height adjusting layer 120 may be formed by introducing an organic material such as silicon oxide or silicon nitride to a preset position and to a preset thickness. In particular, when the height adjusting layer 120 is formed of an organic material, the organic light-emitting display apparatus which is flexible may be provided by removing the substrate 110 as will be described below.

The height adjusting layer 120 may be formed such that the thickness h1 of the height adjusting layer 120 in the first region A1 is greater than the thickness h2 of the height adjusting layer 120 in the second region A2 as described above. To this end, the height adjusting layer 120 may be formed by forming a layer having a uniform thickness and patterning the layer having the uniform thickness such that the thickness h1 in the first region A1 is greater than the thickness h2 in the second region A2. The patterning may be performed by using any of various methods such as photolithography, a laser ablation technique (LAT), or a halftone mask technique.

Figure 2:
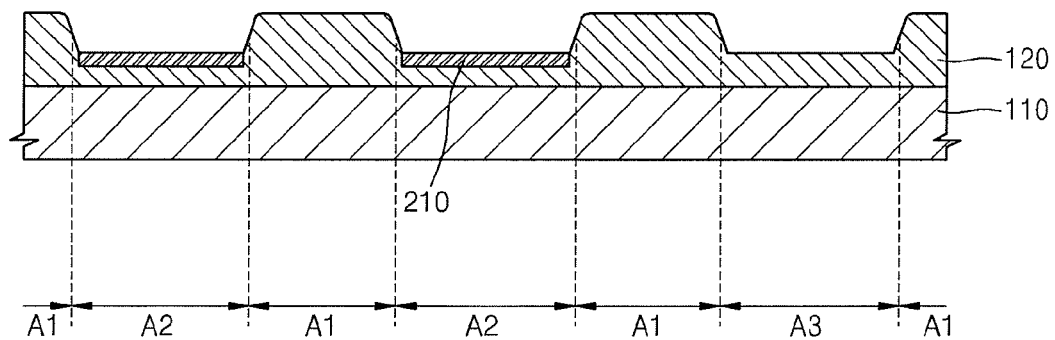

After the height adjusting layer 120 is formed on the substrate 110, a thin film transistor (TFT) 200 is formed on the height adjusting layer 120 to correspond to the second region A2 of the height adjusting layer 120. The TFT is formed to correspond to the section region A2 of the height adjusting layer 120, so the TFT may fill the whole region of the section region A2 of the height adjusting layer 120 or the TFT may fill a partial region of the section region A2 of the height adjusting layer 120. Embodiments of the disclosed technology are not limited to formation of the TFT 200 and any structure which may lead to a stepped portion as will be described below may be formed to correspond to the second region A2 of the height adjusting layer 120. If necessary, a layer may be disposed between the height adjusting layer 120 and the structure. For example, a semiconductor layer 210 is formed in the second region A2 of the height adjusting layer 120 as shown in FIG. 2. The semiconductor layer 210 may be an amorphous silicon layer, an oxide silicon layer, or a polycrystalline silicon layer, or may be formed of an organic semiconductor material. Although not shown in FIG. 2, the semiconductor layer 210 may include a source region and a drain region doped with dopants and a channel region if necessary.

Figure 3:
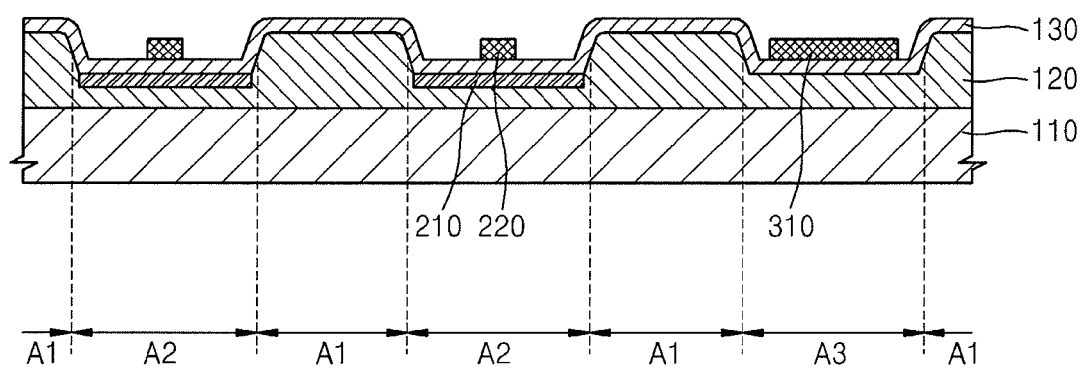

In the following figures, portions of pixel circuits including a TFT and OLED are shown. It will be understood, that a manufactured display will replicate the pixel circuit many times to form a matrix of pixels generally organized as rows and columns. It is the composite of many pixel circuits that are driven to emit light that cause an image, whether still or moving, to be presented to a viewer. Referring to FIG. 3, a gate insulating film 130 is formed to cover the semiconductor layer 210, and a gate electrode 220 is formed on the gate insulating film 130. A first capacitor electrode 310 may be formed at the same time as the gate electrode 220 is formed.

The gate insulating film 130 may be typically formed to cover the first region A1 and the second region A2 of the height adjusting layer 120, that is, to cover an entire surface of the height adjusting layer 120. If necessary, the gate insulating film 130 may be formed in a patterned shape. The gate insulating film 130 may be formed of silicon oxide, silicon nitride, or an insulating organic/inorganic material. Considering an adhesive force with respect to an adjacent layer, a degree of surface planarization of a layer to be stacked, and processability, the gate electrode 220 may be formed to have a single-layer structure or a multi-layer structure by using, for example, aluminium (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), copper (Cu), or an alloy thereof.

Figure 4:
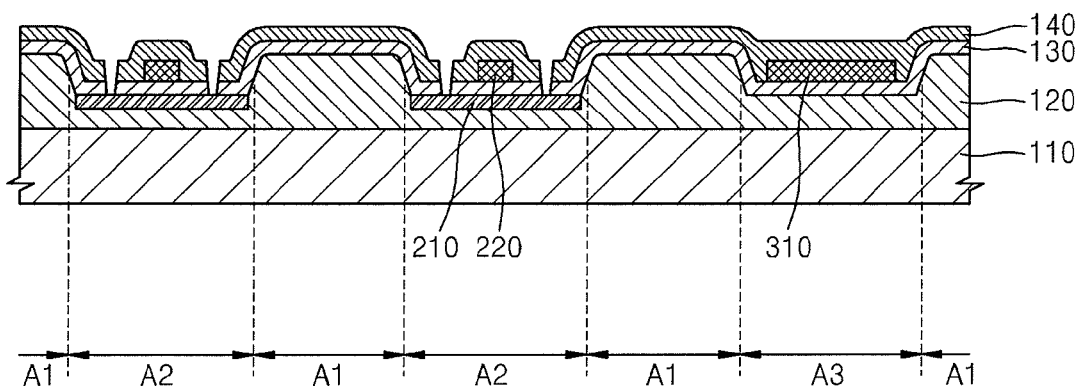
Figure 5:
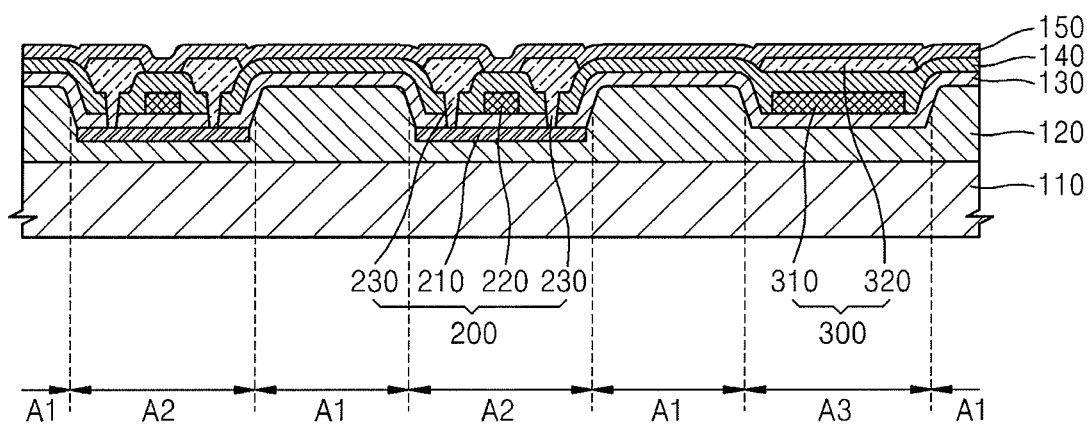

Referring to FIG. 4, an interlayer insulating film 140 is formed to cover the gate electrode 220 and the gate insulating film 130 by using silicon oxide, silicon nitride, and/or an insulating organic/inorganic material, and a contact hole is formed by partially removing the gate insulating film 130 and the interlayer insulating film 140 to expose a preset portion of the semiconductor layer 210. Referring to FIG. 5, source/drain electrodes 230 that contact the semiconductor layer 210 through the contact hole may be formed, thereby preparing the TFT 200. A second capacitor electrode 320 may be formed at the same time as the source/drain electrodes 230 are formed. Accordingly, a capacitor 300 including the first capacitor electrode 310 and the second capacitor electrode 320 may be formed on the substrate 110. Considering a conductivity, the source/drain electrodes 230 may be formed to have a single-layer structure or a multi-layer structure by using, for example, Al, Pt, Pd, Ag, Mg, Au, Ni, Nd, Ir, Cr, Li, Ca, Mo, Ti, W, Cu, or an alloy thereof.

In addition, a protective film 150 is formed to cover the source/drain electrodes 230 of the TFT 200 and the interlayer insulating film 140 by using silicon oxide, silicon nitride, and/or an insulating organic/inorganic material. The protective film 150 is formed to cover the source/drain electrodes 230 and the interlayer insulating film 140, that is, to cover the height adjusting layer 120 and the TFT 200. Since the source/drain electrodes 230 are elements of the TFT 200 and the interlayer insulating film 140 or the gate insulating film 130 covers the height adjusting layer 120, when the interlayer insulating film 140 or the gate insulating film 130 is covered, the height adjusting layer 120 may also be covered. Although not shown, the interlayer insulating film 140 or the gate insulating film 130 may be patterned such that a portion of the height adjusting layer 120 is not covered by the interlayer insulating film 140 or the gate insulating film 130. In this case, the protective film 150 may directly cover the height adjusting layer 120.

The height of the TFT 200 may be in a range from about 0.05 μm to about 5 μm. In some embodiments, the height of the TFT 200 can be in a range of about 0.1 μm to about 5 μm. In some embodiments, the height of the TFT 200 can be in a range of about 0.1 μm to about 3 μm. In some embodiments, the height of the TFT 200 can be in a range of about 0.5 μm to about 5 μm. In some embodiments, the height of the TFT 200 can be in a range of about 0.5 μm to about 3 μm. In some embodiments, the height of the TFT 200 can be in a range of about 1 μm to about 5 μm.

Accordingly, the protective film 150 covers an entire surface or most of the entire surface of the substrate 110. Since the TFT 200 having a multi-layer structure is disposed under the protective film 150 as shown in FIG. 5, a top surface of the protective film 150 may not be sufficiently flat. However, since the height adjusting layer 120, whose thickness h1 in the first region A1 is greater than its thickness h2 in the second region A2, is disposed under the TFT 200 and the TFT 200 is formed to correspond to the second region A2 where the thickness h2 is less, although the top surface of the protective film 150 is not flat, an elevation difference between regions of the top surface of the protective film 150 is not great. This is true even in the third region A3 in which the capacitor 300 is formed. That is, the thickness of the height adjusting layer 120 in the third region A3 may be preset in consideration of thicknesses of the first capacitor electrode 310 and the second capacitor electrode 320 of the capacitor 300. Accordingly, referring to FIG. 6, a planarization film 160 may be formed on the protective film 150 such that a top surface of the planarization film 160 is sufficiently flat.

The elevation difference between regions of the top surface of the protective film 150 may be in a range of about 0.05 μm to about 5 μm. In some embodiments, the elevation difference can be in a range of about 0.1 μm to about 5 μm. In some embodiments, the elevation difference can be in a range of about 0.1 μm to about 3 μm. In some embodiments, the elevation difference can be in a range of about 0.5 μm to about 5 μm. In some embodiments, the elevation difference can be in a range of about 0.5 μm to about 3 μm. In some embodiments, the elevation difference can be in a range of about 1 μm to about 5 μm.

Embodiments of the disclosed technology are not limited to only the TFT 200 or the capacitor 300, and the planarization film 160 may be formed such that the top surface of the planarization film 160 is sufficiently flat by adjusting a height of the height adjusting layer 120 even in a region where other wiring structures are formed. For convenience, the following explanation will focus on only embodiments where the TFT 200 is formed.

The planarization film 160 may be formed of an acryl-based material, polyimide, or benzocyclobutene (BCB), and if necessary, may be formed of silicon oxide, silicon nitride, or the like. The top surface of the planarization film 160 may be planarized by using a mechanical method such as milling if necessary.

If the protective film 150 is omitted when the organic light-emitting display apparatus is manufactured, the planarization film 160 may be formed to cover the height adjusting layer 120 and the TFT 200. In this case, the planarization film 160 is formed to cover the source/drain electrodes 230 and the interlayer insulating film 140, that is, to cover the height adjusting layer 120 and the TFT 200. Since the source/drain electrodes 230 are elements of the TFT 200 and the interlayer insulating film 140 or the gate insulating film 130 covers the height adjusting layer 120, when the interlayer insulating film 140 or the gate insulating film 130 is covered, the height adjusting layer 120 may also be covered. Although not shown, the interlayer insulating film 140 or the gate insulating film 130 may be patterned such that a portion of the height adjusting layer 120 is not covered by the interlayer insulating film 140 or the gate insulating film 130. In this case, the planarization film 160 may directly cover the height adjusting layer 120.

Figure 6:
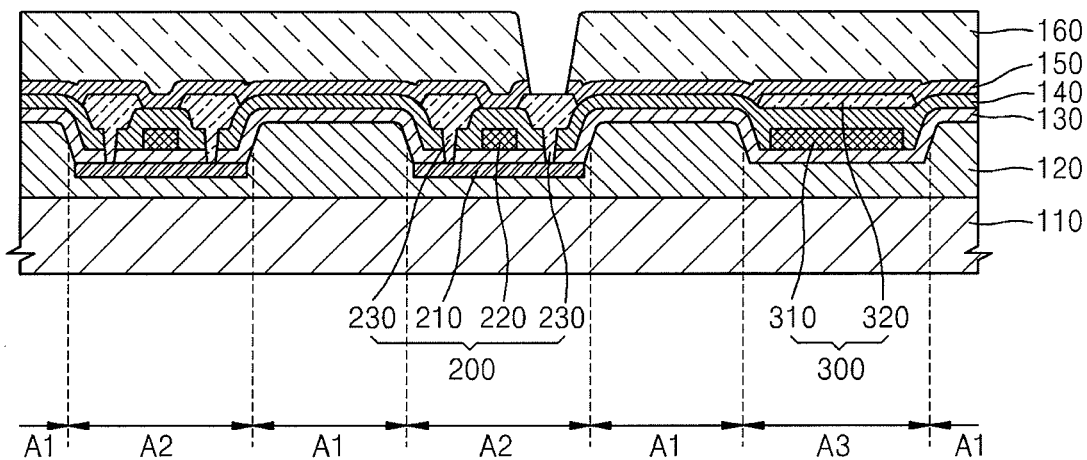
Figure 7:
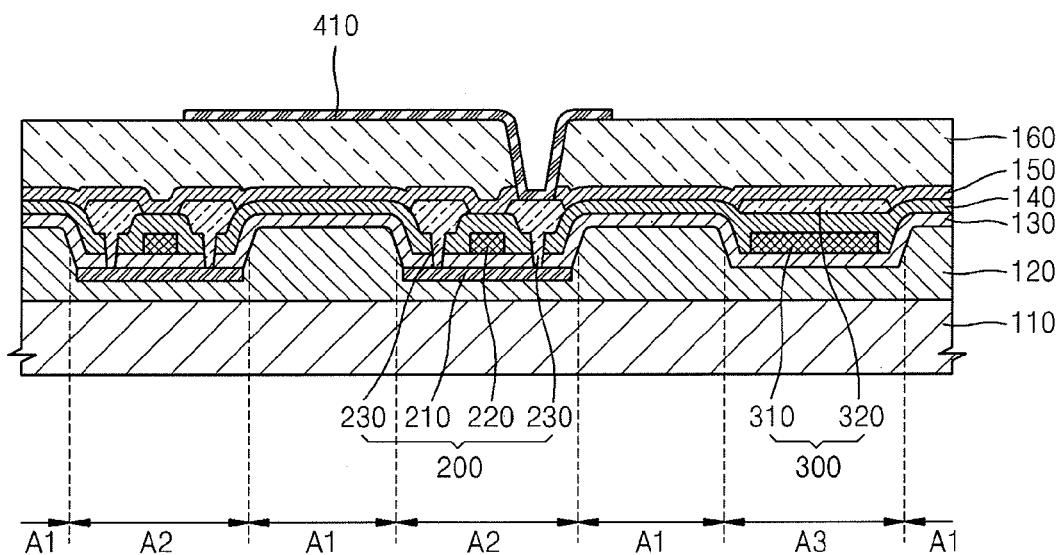
Figure 8:
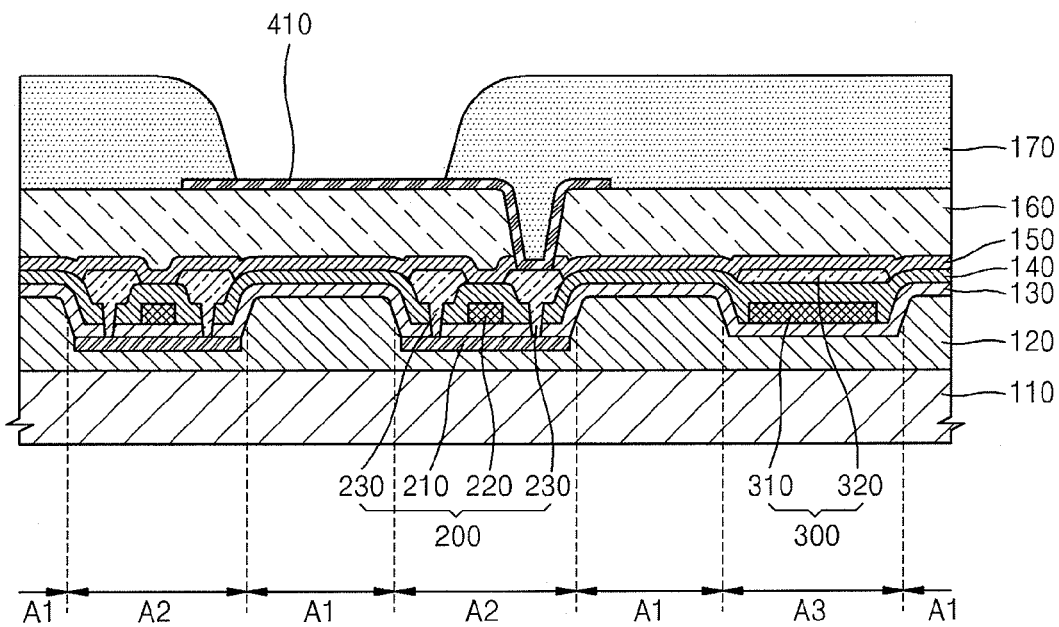

After the planarization film 160 is formed, referring to FIG. 6, a via hole is formed in the protective film 150 and the planarization film 160 to expose any one of the source/drain electrodes 230 of the TFT 200. Referring to FIG. 7, a pixel electrode 410 which is electrically connected to the TFT 200 through the via hole is formed on the planarization film 160. Referring to FIG. 8, a pixel defining film 170 is formed to have a single-layer structure or a multi-layer structure by using an organic material such as polyacrylate or polyimide or an arbitrary inorganic material to expose a portion of the pixel electrode 410 including a central portion of the pixel electrode 410.

The pixel electrode 410 may be a (semi) transparent electrode or a reflective electrode. When the pixel electrode 410 is a (semi) transparent electrode, the pixel electrode 410 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 410 is a reflective electrode, the pixel electrode 410 may include a reflective film formed of Ag, Mg, Al, Pt, Pd, Au, Ni, Nd, Ir, Cr, or a compound thereof and a film formed of ITO, IZO, ZnO, or $In_2O_3$. A structure and a material of the pixel electrode 410 are not limited thereto and may be modified in various ways.

The pixel defining film 170 defines a pixel by having an opening corresponding to each subpixel, that is, an opening through which a central portion of the pixel electrode 410 and the entire pixel electrode 410 is exposed. Also, the pixel defining film 170 may prevent an arc or the like from occurring at an end portion of the pixel electrode 410 by increasing the distance between the end portion of the pixel electrode 410 and a counter electrode 430 (see FIG. 10) that is disposed over the pixel electrode 410.

Figure 9:
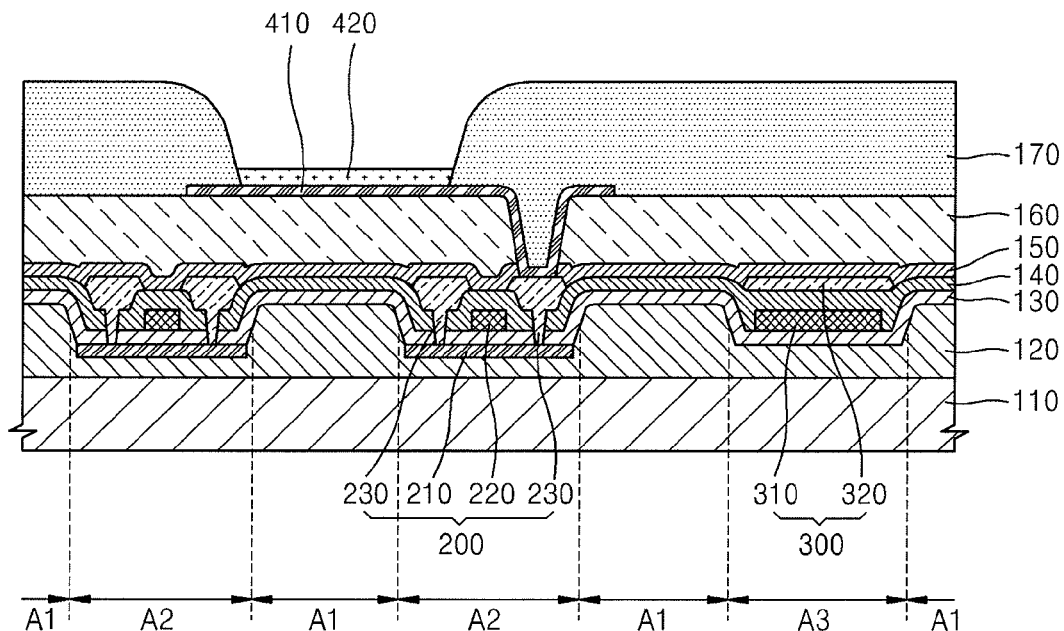

Referring to FIG. 9, an intermediate layer 420 including an emission layer (EML) is formed and the counter electrode 430 is formed to correspond to at least the pixel electrode or most portions of the substrate 110. Accordingly, referring to FIG. 10, the organic light-emitting display apparatus including an organic light-emitting device 400 which is electrically connected to the TFT 200 is manufactured.

The counter electrode 430 may be integrally formed with a plurality of pixels to cover a display region (active region). Here, the term 'display region' refers to any region of the organic light-emitting display apparatus where light may be emitted. For example, the display region may be any region other than an edge of the organic light-emitting display apparatus where a controller or the like is disposed. When a dead area does not exist anywhere on a surface of the organic light-emitting display apparatus, the entire surface of the organic light-emitting display apparatus will form the display region.

In operation, the counter electrode 430 receives an electrical signal from an electrode power supply line by contacting the electrode power supply line disposed outside the display region. The counter electrode 430 may be a (semi) transparent electrode or a reflective electrode. When the counter electrode 430 is a (semi) transparent electrode, the counter electrode 430 may include a film formed of Li, Ca, LiF/Ca, LiF/Al, Al, Mg, or a compound thereof which may be disposed, by using deposition, adjacent to the intermediate layer 420, and an auxiliary electrode or a bus electrode line formed of a (semi) transparent material such as ITO, IZO, ZnO, or $In_2O_3$. When the counter electrode 430 is a reflective electrode, the counter electrode 430 may include a layer including at least one material of, for example, Li, Ca, LiF/Ca, LiF/Al, Al, Ag, and Mg. A structure and a material of the counter electrode 430 are not limited thereto, and may be modified in various ways.

In the organic light-emitting display apparatus manufactured as described above, since the height adjusting layer 120, whose thickness h1 in the first region A1 is greater than its thickness h2 in the second region A2, is provided and the TFT 200 is formed to correspond to the second region A2 in which the thickness h2 is less, even when the planarization film 160 is to be formed and there is an uneven portion under the planarization film 160, the planarization film 160 may be formed to have a substantially flat top surface. Accordingly, since the pixel electrode 410 is also formed on the planarization film 160 to be flat, the thickness of the intermediate layer 420 will be generally uniform when the intermediate layer 420 including the EML is formed on the pixel electrode 410.

Figure 11:
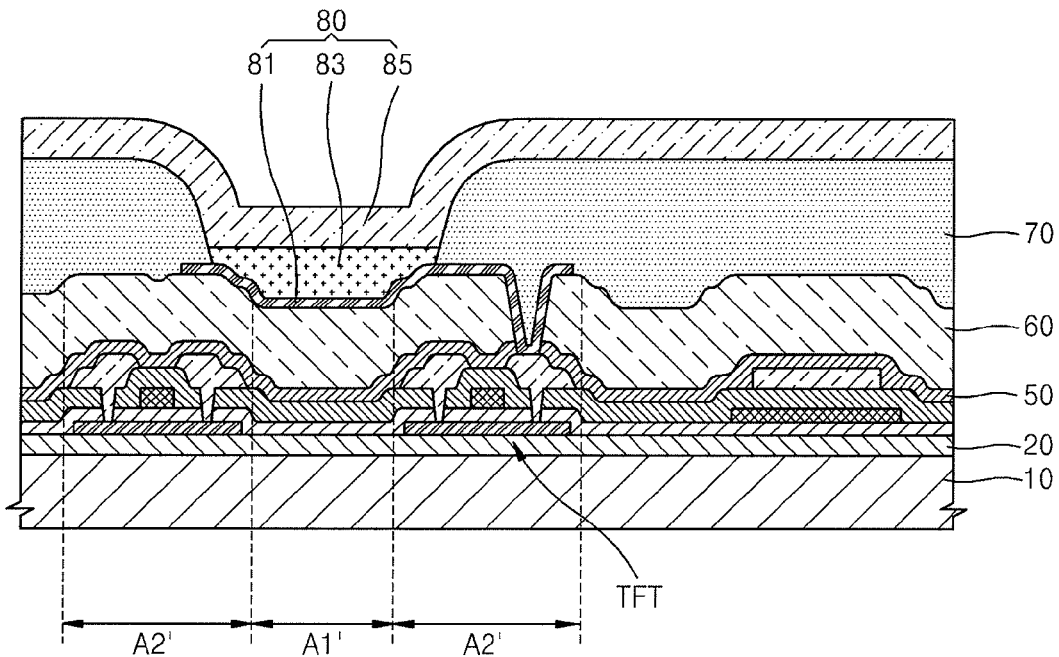
FIG. 11 is a cross-sectional view illustrating an organic light-emitting display apparatus according to a comparative example.

FIG. 11 is a cross-sectional view illustrating an organic light-emitting display apparatus according to a comparative example. Referring to FIG. 11, in the organic light-emitting display apparatus according to the comparative example, which does not include a height adjusting layer, a TFT is formed on a buffer layer 20 of a substrate 10, a protective film 50 and a planarization film 60 are formed to cover the TFT, a pixel electrode 81 is formed on the planarization film 60, a pixel defining film 70 is formed, an intermediate layer 83 including an EML is formed on the pixel electrode 81, and a counter electrode 85 is formed on the intermediate layer 83, thereby manufacturing a structure in which the TFT and an organic light-emitting device 80 are electrically connected to each other.

Since the organic light-emitting display apparatus according to the comparative example does not include a height adjusting layer, there is a large elevation difference on the top surface of the protective film 50 between a first region A1' where the TFT is not formed and a second region A2' where the TFT is formed. Accordingly, when the planarization film 60 that covers the protective film 50 is formed, since the elevation difference between these regions of the top surface of the protective film 50 is large, the top surface of the planarization film 60 also has a substantial elevation difference although the elevation difference of the top surface of the planarization film 60 is less than the elevation difference of the top surface of the protective film 50.

As a result, in the organic light-emitting display apparatus according to the comparative example, the pixel electrode 81 is formed on the planarization film 60 along the uneven top surface of the planarization film 60. Accordingly, when the entire intermediate layer 83 or a portion of the intermediate layer 83 including the EML is formed by using a liquid process such as inkjet printing or nozzle printing on the pixel electrode 81, since a material for forming the intermediate layer 83 is liquid, the intermediate layer 83 may be formed to have a flat top surface irrespective of an unevenness of the pixel electrode 81 disposed under the intermediate layer. As a result, the intermediate layer 83 is formed on the pixel electrode 81 to have a non-uniform thickness. As is apparent from FIG. 11, a thickness of the intermediate layer 83 in the second region A2' is greater than a thickness of the intermediate layer 83 in the first region A1'.

Such a difference in thicknesses of the intermediate layer 83 leads to a difference in the amount of light emitted. That is, since it is known through experiments that electrons and holes are smoothly injected and thus luminance is high in a region where the thickness of the intermediate layer 83 is small and electrons and holes are not smoothly injected and luminance is low in a region where the thickness of the intermediate layer 83 is great, luminances of light emitted from subpixels are not uniform. (In actual fact, each "pixel" in the display is generally made up of a number of different color subpixels, e.g., a set of three subpixel circuits that emit red, green and blue light.)

However, according to certain embodiments of the organic light-emitting display apparatus, before the TFT 200 is formed, the height adjusting layer 120, whose thickness h1 in the first region A1 is greater than its thickness h2 in the second region A2, is formed, and the TFT 200 is formed to correspond to the second region A2 of the height adjusting layer A2 where the thickness of the height adjusting layer 120 is less. Accordingly, even when the top surface of the protective film 150 that covers the height adjusting layer 120 and the TFT 200 is not flat, the elevation difference between regions of the top surface of the protective film 150 is much less than that of the organic light-emitting display apparatus according to the comparative example.

Since the elevation difference between regions of the top surface of the protective film 150 is not large, the top surface of the planarization film 160 that covers the protective film 150 is sufficiently flat, and thus, the pixel electrode 410 disposed on the planarization film 160 is also flat. Accordingly, even though the intermediate layer 420 including the EML is formed on the pixel electrode 410 by using a liquid process, the intermediate layer 420 may be formed to have a substantially uniform thickness. Accordingly, luminance uniformity of the light emitted from subpixels improves, the quality of the organic light-emitting display apparatus greatly improves, and manufacturing yields increase. Not all layers of the entire intermediate layer 420 have to be formed by using a liquid process, and some of the layers of the intermediate layer 420 may be formed by using a process such as deposition and other layers may be formed by using a liquid process.

When the intermediate layer 420 is based on a liquid material, the intermediate layer 420 may have a structure including all or some of a hole injection layer (HIL), a hole transport layer (HTL), an interfacial control layer (e.g., an interlayer or a primer layer), and the EML. Examples of the liquid material may include a high molecular weight material, a low molecular weight material, or a dendrimer.

The HTL may be formed of poly-(3,4)-ethylene-dihydroxy thiophene (PEDOT), polyaniline (PANI), doped or undoped polythiophene, or a p-doped material. The EML may be formed of a high molecular weight material, a low molecular weight material (typically, a soluble low molecular weight material), or a dendrimer which may be manufactured as a liquid fluorescent or phosphorescent material. Examples of the high molecular weight material may include a poly-phenylenevinylene (PPV)-based material and a polyfluorene-based material. The low molecular weight material may be a typical low molecular weight material or a material which may be liquefied by adding a functional group for liquefaction to a specially devised material.

The pixel defining film 170 may be formed by using a liquid process such that when a liquid material is applied to the pixel electrode 410, a portion of a surface of the pixel defining film 170 which contacts the liquid material, that is, a portion of the pixel defining film 170 adjacent to the pixel electrode 410, is formed of a material having a relatively high surface energy and thus high wettability, such as silicon nitride or silicon oxide, and other portions of the pixel defining film 170 are formed of an organic material. That is, at least one portion of an opening of the pixel defining film 170 which defines a pixel and other portions of the pixel defining film 170 may be formed of different materials, and in this case, a surface energy of the material used to form the at least one portion may be higher than a surface energy of the material used to form the other portions. In particular, by increasing the surface energy of the material used to form the other portions, a liquid material may be concentrated at the pixel electrode 410 instead of a top surface of the pixel defining film 170 during a liquid process.

Such adjustment of the surface energy may be performed by using a method of emitting light having a specific wavelength or plasma to temporarily or permanently change the surface energy of a surface to be treated.

Assuming that the organic light-emitting display apparatus is a bottom emission organic light-emitting display apparatus in which light is emitted from the EML to the environment outside the display through the pixel electrode 410 and the substrate 110 disposed under the pixel electrode 410, when the TFT 200 or a wiring structure is disposed under the pixel electrode 410, there is a limitation in emitting light. Accordingly, when the organic light-emitting display apparatus is a bottom emission light-emitting display apparatus, it is preferable that a structure which may lead to a stepped portion is not disposed under the pixel electrode 410.

When the organic light-emitting display apparatus is a top emission organic light-emitting display apparatus in which light is emitted from the EML to the environment outside the display through the counter electrode 430, the probability that a structure which may lead to a stepped portion, for example, the TFT 200, is disposed under the pixel electrode 410 is high. Accordingly, when the organic light-emitting display apparatus is a top emission organic light-emitting display apparatus, it may be particularly effective to improve light-emission efficiency by substantially planarizing a top surface of the planarization film 160 on which the pixel electrode 410 is to be formed by using the height adjusting layer 120.

In order to reduce an elevation difference between regions of a top surface of the protective film 150 disposed under the planarization film 160, the height adjusting layer 120 may be formed such that a difference between the thickness h1 of the height adjusting layer 120 in the first region A1 and the thickness h2 of the height adjusting layer 120 in the second region A2 corresponds to a height of the TFT 200. Accordingly, when the TFT 200 is formed in the second region A2 of the height adjusting layer 120, after the TFT 200 is formed, an elevation difference of a top surface between the second region A2 where the TFT 200 is formed and the first region A1 where the TFT 200 is not formed may be minimized. In FIG. 5, the term 'top surface' may refer to a top surface of a portion other than the protective film 150, that is, a top surface of the TFT 200 in a region where the TFT 200 is formed and a top surface of the interlayer insulating film 140 in a region where the TFT 200 is not formed.

When a difference between the thickness h1 of the height adjusting layer 120 in the first region A1 and the thickness h2 of the height adjusting layer 120 in the second region A2 corresponds to a height of the TFT 200, it does not necessarily mean that the difference between the thickness h1 of the height adjusting layer 120 in the first region A1 and the thickness h2 of the height adjusting layer 120 in the second region A2 is numerically exactly the same as the height of the TFT 200. For example, the gate insulating film 130 or the interlayer insulating film 140 may be required in order to form the TFT 200 as shown in FIG. 5. The gate insulating film 130 or the interlayer insulating film 140 may be formed even in a region where the TFT 200 is not formed (to cover the height adjusting layer 120). Accordingly, the difference between the thickness h1 of the height adjusting layer 120 in the first region A1 and the thickness h2 of the height adjusting layer 120 in the second region A2 may be slightly less than the height of the TFT 200 (which is, for example, the height between the bottom surface of the semiconductor layer 210 and the top surface of the source/drain electrodes 230).

When the height adjusting layer 120, whose thickness h1 in the first region A1 is greater than its thickness h2 in the second region A2, is formed before the TFT 200 is formed, in order to precisely adjust the thicknesses h1 and h2, a top surface of the protective film 150 that covers the height adjusting layer 120 and the TFT 200 may be almost flat. In this case, by forming a substantially flat pixel electrode on the protective film 150 without an additional planarization film, even when at least one layer of the intermediate layer is formed by using a method including a liquid process, the layer may be formed to have a substantially uniform thickness.

The term "substantially uniform thickness" or "substantially uniform surface" as used herein refer to a surface or thickness that has a thickness or surface height variations of less than 500 angstrom. In some embodiments, a substantially uniform thickness" or "substantially uniform surface can be a surface or thickness that has a thickness or surface height variations of less than 400 angstrom. In some embodiments, a substantially uniform thickness" or "substantially uniform surface can be a surface or thickness that has a thickness or surface height variations of less than 300 angstrom. In some embodiments, a substantially uniform thickness" or "substantially uniform surface can be a surface or thickness that has a thickness or surface height variations of less than 200 angstrom. In some embodiments, a substantially uniform thickness" or "substantially uniform surface can be a surface or thickness that has a thickness or surface height variations of less than 100 angstrom.

Figure 12:
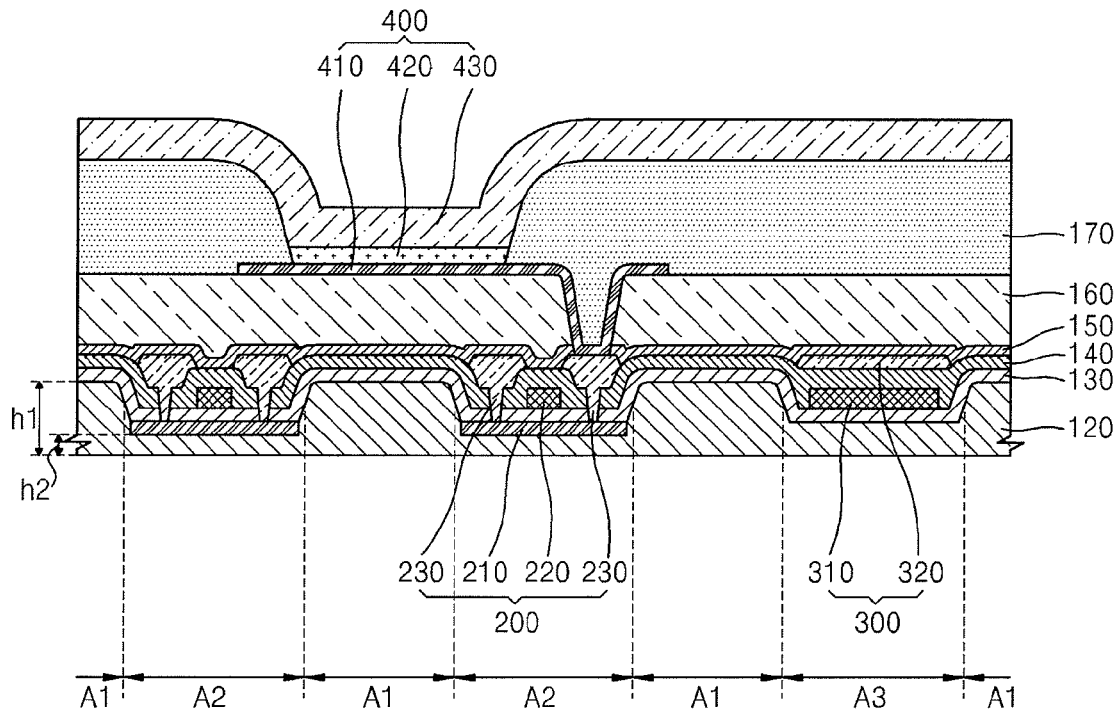
FIG. 12 is a cross-sectional view illustrating an organic light-emitting display apparatus according to another embodiment of the disclosed technology.

A method of manufacturing the organic light-emitting display apparatus according to another embodiment of the disclosed technology may additionally include a process of removing the substrate 110 as shown in FIG. 12. In this case, the height adjusting layer 120 is exposed to the outside and thus acts as a substrate. If a buffer layer is disposed between the height adjusting layer 120 and the substrate 110, a layer which is finally exposed to the outside as the substrate 110 is removed may become the buffer layer. For example, one or more polyimide layers may be disposed on a bottom surface of the height adjusting layer 120. In this case, an inorganic insulating layer may be interposed between the polyimide layers and the height adjusting layer 120.

When the organic light-emitting display apparatus is manufactured, a process of forming various layers and patterning the various layers is performed. Accordingly, the substrate 110 passes through various chambers. In this case, since handling stability is very important, it is preferable that the substrate 110 is sufficiently thick. The organic light-emitting display apparatus which is designed to be relatively thin may be manufactured so as to improve handling stability by using the substrate 110 which is sufficiently thick and, in a final process step, removing the substrate 110.

In order to manufacture the organic light-emitting display apparatus which is flexible, many of various layers need to be flexible. However, in this case, handling stability may be reduced due to the flexibility during the manufacturing process. Accordingly, the organic light-emitting display apparatus which is flexible may be manufactured by improving handling stability by using the substrate 110 which is sufficiently thick and sufficiently strong and finally removing the substrate 110.

The substrate 110 does not have to be removed after the counter electrode 430 is formed, or after the counter electrode 430 is formed and then an encapsulation layer (not shown) or the like is formed. For example, as shown in FIG. 5, after the protective film 150 that covers the TFT 200 is formed, the substrate 110 may be removed and the planarization film 160 may be formed. Alternatively, as shown in FIG. 7, after the pixel electrode 410 is formed, the substrate 110 may be removed and then the pixel defining film 170 may be formed. Alternatively, after the pixel defining film 170 is formed, the substrate 110 may be removed. Alternatively, as shown in FIG. 5, before the protective film 150 is formed, the substrate 110 may be removed.

Although a method of manufacturing a organic light-emitting display apparatus has been described, the disclosed technology is not limited thereto. A method of manufacturing a TFT substrate may also be within the scope of the disclosed technology.

The term 'TFT substrate' refers to a state where the TFT 200 is formed on the substrate 110. That is, the TFT substrate may refer to a state where the height adjusting layer 120, the TFT 200, and the protective film 150 that covers the height adjusting layer 120 and the TFT 200 are formed on the substrate 110 as shown in FIG. 5, or a state where the height adjusting layer 120, the TFT 200, the protective film 150, and the planarization film 160 is formed on the substrate 110 as shown in FIG. 6. If necessary, the TFT substrate may refer to a state where the height adjusting layer 120, the TFT 200, the protective film 150, the planarization film 160, and the pixel electrode 410 are formed on the substrate 110. Alternatively, the TFT substrate may refer to a state where only the TFT 200 without the protective film 150 is formed on the substrate 110 in FIG. 5.

The method of manufacturing the TFT substrate may include operations other than some of the operations described in the method of manufacturing the organic light-emitting display apparatus.

That is, the method of manufacturing the TFT substrate may include an operation of forming the height adjusting layer 120 such that the thickness h1 of the height adjusting layer 120 in the first region A1 is greater than the thickness h2 of the height adjusting layer 120 in the second region A2 as shown in FIG. 1, and an operation of forming the TFT 200 on the height adjusting layer 120 to correspond to the second region A2 of the height adjusting layer 120 as shown in FIGS. 2 through 5. The height adjusting layer 120 may be formed of, for example, an organic material such as PET, PEN, polyacrylate, or polyimide.

The height adjusting layer 120 may be formed such that a difference between the thickness h1 of the height adjusting layer 120 in the first region A1 and the thickness h2 of the height adjusting layer 120 in the second region A2 corresponds to a height of the TFT 200. Accordingly, when the TFT 200 is formed in the second region A2 of the height adjusting layer 120, an elevation difference of a top surface between the second region A2 where the TFT 200 is formed and the first region A1 where the TFT 200 is not formed may be minimized.

When the difference between the thickness h1 of the height adjusting layer 120 in the first region A1 and the thickness h2 of the height adjusting layer 120 in the second region A2 corresponds to the height of the TFT 200, it does not necessarily mean that the difference between the thickness h1 of the height adjusting layer 120 in the first region A1 and the thickness h2 of the height adjusting layer 120 in the second region A2 is the same as the height of the TFT 200 as described above in the method of manufacturing the organic light-emitting display apparatus.

The method of manufacturing the TFT substrate may further include an operation of forming the planarization film 160 to cover the TFT 200, or forming the protective film 150 before the planarization film 160 is formed as shown in FIG. 5 and then forming the planarization film 160 on the protective film 150 as shown in FIG. 6. If necessary, the method of manufacturing the TFT substrate may include an operation of forming the pixel electrode 410 on the planarization film 160 to be electrically connected to the TFT 200 through a via hole.

The method of manufacturing the TFT substrate may also include a final process step of removing the substrate 110. In this case, the height adjusting layer 120 may substantially act as a substrate for carrying the TFTs. If a layer such as a buffer layer is disposed between the substrate 110 and the height adjusting layer 120, after the substrate 110 is removed, the layer such as the buffer layer may substantially act as a substrate or a layer exposed to the outside environment. The substrate 110 may be removed in various ways. For example, the substrate 110 may be removed before or after the TFT 200 is formed, or after the planarization film 160 is formed.

Although a method of manufacturing an organic light-emitting display apparatus and a method of manufacturing a TFT substrate have been described, the organic light-emitting display apparatus and the TFT substrate are also within the scope of the disclosed technology.

Figure 10:
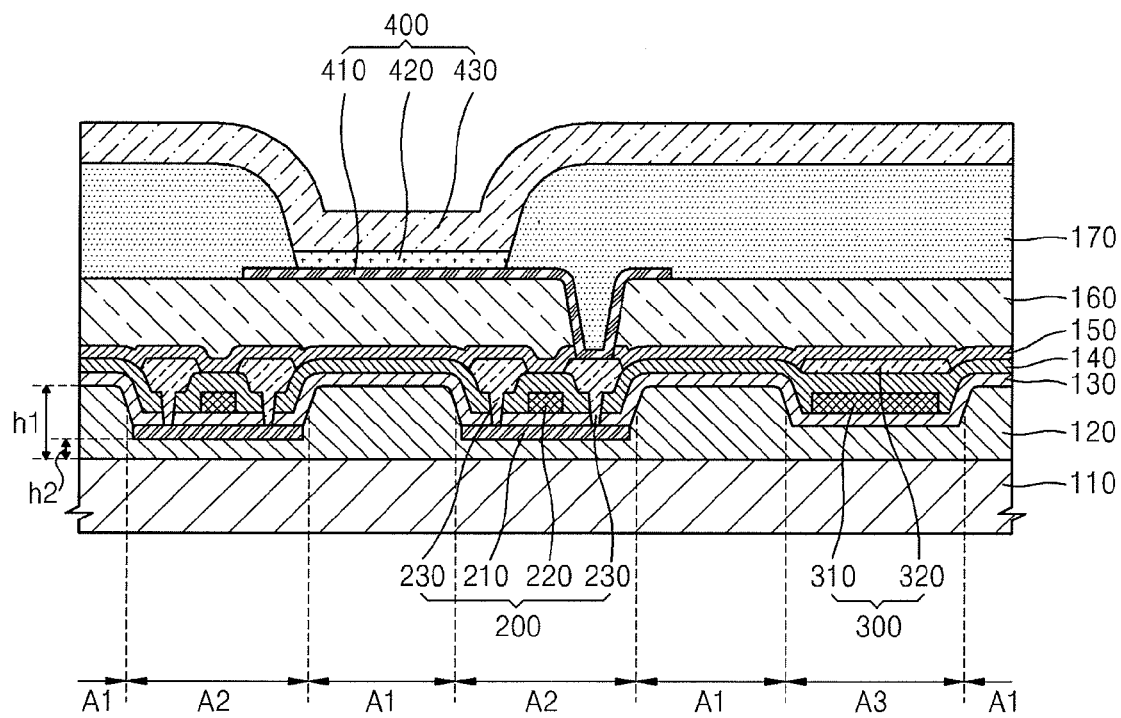
FIG. 10 is a cross-sectional view illustrating an organic light-emitting display apparatus according to another embodiment of the disclosed technology.

The organic light-emitting display apparatus may be configured as shown in FIG. 10. That is, the organic light-emitting display apparatus may include the substrate 110, the height adjusting layer 120 whose thickness h1 in the first region A1 is greater than its thickness h2 in the second region A2, the TFT 200 that is formed on the height adjusting layer 120 to correspond to the second region A2 of the height adjusting layer 120, the planarization film 160 that is disposed over the height adjusting layer 120 and the TFT 200 and has a flat top surface, and the organic light-emitting device 400 that is electrically connected to the TFT 200. The height adjusting layer 120 may include, for example, an organic material such as PET, PEN, polyacrylate, or polyimide.

Since the organic light-emitting display apparatus may minimize an elevation difference between regions of a top surface of the planarization film 150 which needs to be flat due to the height adjusting layer 120, the top surface of the planarization film 160 may be substantially flat. As a result, since the intermediate layer 420 including the EML is formed by using a liquid process to have a uniform thickness, the organic light-emitting display apparatus which has high quality and high luminance uniformity of light emitted from subpixels may be provided.

A difference between the thickness h1 of the height adjusting layer 120 in the first region A1 and the thickness h2 of the height adjusting layer 120 in the second region A2 may correspond to a height of the TFT 200. Accordingly, an elevation difference of a top surface between the second region A2 where the TFT 200 is disposed and the first region A1 where the TFT 200 is not disposed may be minimized.

When the difference between the thickness h1 of the height adjusting layer 120 in the first region A1 and the thickness h2 of the height adjusting layer 120 in the second region A2 corresponds to the height of the TFT 200, it does not necessarily mean that the difference between the thickness h1 of the height adjusting layer 120 in the first region A1 and the thickness h2 of the height adjusting layer 120 in the second region A2 is numerically exactly the same as the height of the TFT 200 as described above in the method of manufacturing the organic light-emitting display apparatus.

The organic light-emitting display apparatus may further include the protective film 150 disposed between the planarization film 160, and the height adjusting layer 120 and the TFT 200. The protective film 150 may prevent impurities from affecting the organic light-emitting device 400 disposed over the protective film 150.

FIG. 12 is a cross-sectional view illustrating an organic light-emitting display apparatus according to another embodiment of the disclosed technology. Referring to FIG. 12, the organic light-emitting display apparatus may not include the substrate 110. In this case, the height adjusting layer 120, whose thickness h1 in the first region A1 is greater than its thickness h2 in the second region A2, may act as a substrate. That is, the organic light-emitting display apparatus of FIG. 12 includes as a substrate the height adjusting layer 120 whose thickness h1 in the first region A1 is greater than its thickness h2 in the second region A2. Other elements and configurations are the same as those of the organic light-emitting display apparatus in FIG. 10.

Since the organic light-emitting display apparatus of FIG. 12 does not include the substrate 110 unlike the organic light-emitting display apparatus of FIG. 10, the organic light-emitting display apparatus may be thin. In addition, the organic light-emitting display apparatus which is flexible may be provided by not including the substrate 110 whose flexibility is low and including elements of which many are flexible.

Although the organic light-emitting display apparatus has been described, the disclosed technology is not limited thereto. For example, the disclosed technology may apply to an organic light-emitting illumination apparatus. That is, any organic light-emitting apparatus including a height adjusting layer, a TFT, and an organic light-emitting device may be within the scope of the disclosed technology.

A TFT substrate according to another embodiment of the disclosed technology may include elements other than some elements of the organic light-emitting display apparatus.

That is, the TFT substrate may include the substrate 110, the height adjusting layer 120 whose thickness h1 in the first region A1 is greater than its thickness h2 in the second region A2, and the TFT 200 as shown in FIG. 5. Also, the TFT substrate may further include the protective film 150 as shown in FIG. 5, and may further include the planarization film 160 as shown in FIG. 6. In the latter case, the protective film 150 may be omitted if necessary. If necessary, the TFT substrate may further include the pixel electrode 410 disposed on the planarization film 150 to be electrically connected to the TFT 200 through a via hole.

A difference between the thickness h1 of the height adjusting layer 120 in the first region A1 and the thickness h2 of the height adjusting layer 120 in the second region A2 may correspond to a height of the TFT 200. Accordingly, when the TFT 200 is disposed in the second region A2 of the height adjusting layer 120, an elevation difference of a top surface between the second region A2 where the TFT 200 is disposed and the first region A1 where the TFT 200 is not disposed may be minimized.

When the difference between the thickness h1 of the height adjusting layer 120 in the first region A1 and the thickness h2 of the height adjusting layer 120 in the second region A2 corresponds to the height of the TFT 200, it does not necessarily mean that the difference between the thickness h1 of the height adjusting layer 120 in the first region A1 and the thickness h2 of the height adjusting layer 120 in the second region A2 is numerically exactly the same as the height of the TFT 200 as described above in the method of manufacturing the organic light-emitting display apparatus.

The TFT substrate may not include the substrate 110. In this case, the height adjusting layer 120, whose thickness h1 in the first region A1 is greater than its thickness h2 in the second region, may act as a substrate. That is, the TFT substrate may include as a substrate the height adjusting layer 120 whose thickness h1 in the first region A1 is greater than the thickness h2 in the second region A2. Other elements and configurations are the same as those of the TFT substrate of the previous example.

Since the TFT substrate does not include the substrate 110, the TFT substrate may be thin. The TFT substrate which is flexible may be provided by not including the substrate 110 whose flexibility is low and including other elements of which many are flexible.

As described above, according to the embodiments of the disclosed technology, a TFT substrate which may facilitate a subsequent process by reducing an elevation difference between regions of a top surface, an organic light-emitting apparatus including the TFT substrate, a method of manufacturing the TFT substrate, and a method of manufacturing the organic light-emitting apparatus may be provided. The scope of the disclosed technology is not limited to the above effects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor (TFT) substrate, comprising:
    a substrate;
    a height adjusting layer that is formed on the substrate and has a thickness in a first region greater than a thickness in a second region;
    a TFT including a semiconductor layer different from the height adjusting layer, the TFT being formed on the second region of the height adjusting layer; and
    a capacitor formed in a third region, wherein the height adjusting layer is further formed in the third region, and wherein the thickness of the height adjusting layer in the third region is greater than the thickness of the height adjusting layer in the second region and less than the thickness of the height adjusting layer in the first region.

2. The TFT substrate of claim 1, wherein the difference in the thickness of the height adjusting layer in the first region and the thickness of the height adjusting layer in the second region corresponds to the height of the TFT.

3. The TFT substrate of claim 1, wherein the height adjusting layer comprises an organic material.

4. The TFT substrate of claim 1, further comprising a planarization film that is formed to cover the height adjusting layer and the TFT.

5. The TFT substrate of claim 4, further comprising a protective film that is formed between the planarization film, and the height adjusting layer and the TFT.

6. The TFT substrate of claim 1, further comprising a pixel electrode that is electrically connected to the TFT.

7. An organic light-emitting apparatus comprising:
    the TFT substrate of claim 6;
    an intermediate layer that is formed on the pixel electrode and comprises an emission layer (EML); and
    a counter electrode that is formed on the intermediate layer.

8. The organic light-emitting apparatus of claim 7, wherein light is emitted from the EML to the environment outside the apparatus through the counter electrode.

9. A thin film transistor (TFT) substrate, comprising:
    a substrate that has a thickness in a first region greater than a thickness in a second region;
    a TFT including a semiconductor layer different from the substrate, the TFT being formed on the second region of the substrate; and
    a capacitor formed in a third region, wherein the substrate is further formed in the third region, and wherein the thickness of the substrate in the third region is greater than the thickness of the substrate in the second region and less than the thickness of the substrate in the first region.

10. The TFT substrate of claim 9, wherein the difference in the thickness of the substrate in the first region and the thickness of the substrate in the second region corresponds to a height of the TFT.

11. The TFT substrate of claim 9, wherein the substrate is formed of an organic material.

12. The TFT substrate of claim 9, further comprising a planarization film that is formed to cover the substrate and the TFT.

13. The TFT substrate of claim 12, further comprising a protective film that is formed between the planarization film, and the substrate and the TFT.

14. The TFT substrate of claim 9, further comprising a pixel electrode that is electrically connected to the TFT.

15. An organic light-emitting apparatus comprising:
the TFT substrate of claim 14;
an intermediate layer that is formed on the pixel electrode and comprises an emission layer (EML); and
a counter electrode that is formed on the intermediate layer.

16. The organic light-emitting apparatus of claim 15, wherein light is emitted from the EML to the environment outside the apparatus through the counter electrode.

17. A method of manufacturing a thin film transistor (TFT) substrate, the method comprising:
forming a height adjusting layer on a substrate such that a thickness of the height adjusting layer in a first region is greater than a thickness of the height adjusting layer in a second region;
forming a TFT including a semiconductor layer different from the height adjusting layer on the second region of the height adjusting layer; and
forming a capacitor in a third region, wherein the height adjusting layer is further formed in the third region, and wherein the thickness of the height adjusting layer in the third region is greater than the thickness of the height adjusting layer in the second region and less than the thickness of the height adjusting layer in the first region.

18. The method of claim 17, wherein the forming of the height adjusting layer comprises forming the height adjusting layer such that a difference between the thickness of the height adjusting layer in the first region and the thickness of the height adjusting layer in the second region corresponds to a height of the TFT.

19. The method of claim 17, wherein the forming of the height adjusting layer comprises forming the height adjusting layer by using an organic material.

20. The method of claim 17, further comprising forming a planarization film to cover the height adjusting layer and the TFT.

21. The method of claim 17, further comprising forming a protective film to cover the height adjusting layer and the TFT and forming a planarization film on the protective film.

22. The method of claim 17, further comprising removing the substrate.

23. The method of claim 17, further comprising forming a pixel electrode configured to be electrically connected to the TFT.

24. The method of claim 23, further comprising removing the substrate.

25. A method of manufacturing an organic light-emitting apparatus, the method comprising:
preparing a thin film transistor (TFT) substrate manufactured by using the method of claim 23;
forming an intermediate layer comprising an emission layer (EML) on the pixel electrode; and
forming a counter electrode on the intermediate layer.

26. The method of claim 25, further comprising removing the substrate.

27. The method of claim 25, wherein the forming of the intermediate layer comprises forming the intermediate layer by using a liquid process.

28. A method of manufacturing an organic light-emitting apparatus, the method comprising:
preparing a thin film transistor (TFT) substrate manufactured by using the method of claim 24;
forming an intermediate layer comprising an emission layer (EML) on the pixel electrode; and
forming a counter electrode on the intermediate layer.

29. The method of claim 28, wherein the forming of the intermediate layer comprises forming the intermediate layer by using a liquid process.

30. The TFT substrate of claim 1, wherein the TFT comprises a plurality of TFTs formed only on the second region of the height adjusting layer.

31. The TFT substrate of claim 1, wherein the height adjusting layer is continuously formed across the substrate.

* * * * *